United States Patent [19]

Yonemoto et al.

[11] Patent Number: 5,216,489
[45] Date of Patent: Jun. 1, 1993

[54] SOLID STATE IMAGE SENSOR

[75] Inventors: Kazuya Yonemoto, Tokyo; Tetsuya Iizuka, Kanagawa; Kazushi Wada, Kanagawa; Koichi Harada, Kanagawa; Satoshi Nakamura, Kanagawa, all of Japan

[73] Assignee: Sony Corporation, Tokyo, Japan

[21] Appl. No.: 663,428

[22] Filed: Mar. 1, 1991

[30] Foreign Application Priority Data

Mar. 2, 1990 [JP] Japan ................................ 2-49635
Mar. 8, 1990 [JP] Japan ................................ 2-54932

[51] Int. Cl.$^5$ .......................................... H01L 29/78
[52] U.S. Cl. ...................................... 377/60; 257/231; 257/245
[58] Field of Search .................. 357/7, 23.1, 24, 25, 357/29-32

[56] References Cited

U.S. PATENT DOCUMENTS

| | | | |
|---|---|---|---|
| 4,176,369 | 11/1979 | Nelson et al. | 357/24 |
| 4,677,453 | 6/1987 | Matsumoto et al. | 357/30 |
| 4,808,834 | 2/1989 | Kimata | 357/30 X |
| 4,837,630 | 6/1989 | Ueda | 385/213.26 |
| 4,853,786 | 8/1989 | Yamawaki et al. | 385/213.29 |
| 4,862,237 | 8/1989 | Morozumi | 357/30 |
| 5,041,913 | 8/1991 | Abe | 357/32 X |
| 5,075,244 | 12/1991 | Sakai et al. | 357/30 X |

Primary Examiner—John D. Lee
Assistant Examiner—S. W. Barns
Attorney, Agent, or Firm—Hill, Steadman & Simpson

[57] ABSTRACT

An interline transfer or frame interline transfer CCD solid image sensor is adapted to read out signal charges from light receiving sections of a matrix array by means of vertical charge transfer sections and horizontal charge transfer sections. A plurality of horizontal charge transfer sections are formed for lowering the horizontal transfer frequency. The voltage transition in the transfer gate across the horizontal charge transfer sections is caused to occur stepwise or temporally slowly to improve the transfer efficiency across the horizontal charge transfer sections. A smear drain region for sweeping out unnecessary charges is formed along the horizontal charge transfer sections. The transfer electrode of the horizontal charge transfer sections connected to the busline wiring is patterned to clear contact holes provided in the smear drain region to provide for positive overflow without increasing the chip area.

7 Claims, 7 Drawing Sheets

*(PRIOR ART)*

SOLID STATE IMAGE SENSOR

BACKGROUND OF THE INVENTION

1. Field of the Invention

This invention relates to an interline transfer or frame interline transfer CCD type solid state image sensor. More particularly, it relates to a CCD type solid state image sensor having an improved horizontal charge transfer section.

2. Description of the Prior Art

With a solid-state image device having an extremely large number of pixels, transfer of signal charges becomes difficult because of the increased horizontal transfer frequency. For lowering the horizontal transfer frequency, it has been envisaged to provide two or more horizontal charge transfer sections or horizontal registers and to transfer signal charges by distributing the signal charges thereto.

For example, in a solid state image sensor shown in FIG. 1 in which there are provided two parallel horizontal charge transfer sections 1 and 2 and in which signal charges are transferred at an elevated speed through the horizontal charge transfer sections by two-phase transfer signals $\phi H1$ and $\phi H2$, a transfer electrodes 3 of the two horizontal charge transfer sections, striding over transfer gate 4, are used in common, and are supplied with common transfer signals $\phi H1$ and $\phi H2$. A channel region 5, sandwitched between channel stop regions 6, is provided below the transfer gate 4, and signal charges are transferred from the horizontal charge transfer section 1 to the horizontal charge transfer section 2 by way of the channel region 5. The channel region 5 is sandwitched between a region of the horizontal charge transfer section 1 supplied with the transfer signal $\phi H2$ and a region of the horizontal charge transfer section 2 supplied with the transfer signal $\phi H1$. The region 7 of the horizontal charge transfer section 1, supplied with the transfer signal $\phi H1$, is contiguous to the channel stop region 6 below the transfer gate 4.

FIGS. 2a to 2d are diagrams for illustrating charge transfer between horizontal charge transfer sections from the aspect of the electrical potential. It is assumed that signal charges are transferred from a region of the transfer signal $\phi H2$ of the horizontal charge transfer section 1 to a region of the transfer signal $\phi H1$ of the horizontal charge transfer section 2 by way of transfer gate 4 controlled by a signal $\phi HHG$. First, as shown in FIG. 2a, the signal HHG is raised in level to render the transfer gate 4 conductive, while the transfer signals $\phi H1$ and $\phi H2$ are set to a low level. This causes charges to be stored in the channel region 5 below the transfer gate 4. Then, as shown in FIG. 2b, only the transfer signal $\phi H1$ supplied to the destination is changed to a higher level. This causes the charges stored in the channel region 5 below the transfer gate 4 to be transferred to a region supplied with the transfer signal $\phi H1$ of the other horizontal charge transfer section. Then, for turning the transfer gate 4 off, the signal $\phi HHG$ is changed from the high level to the low level, as shown in FIG. 2c. When the signal $\phi HHG$ is completely in the low level, as shown in FIG. 2d, the two horizontal charge transfer sections 1 and 2 are electrically isolated from each other to complete the distributed transfer of the signal charges.

The above described charge transfer between the horizontal charge transfer sections has the following demerit.

That is, while the transfer gate between two horizontal charge transfer sections need to be turned off on termination of transfer of signal charges, the signal charges present in the channel region 5 below the transfer gate when the level is changed to turn off the transfer gate tend to be returned to the horizontal charge transfer section 1 to lower the transfer efficiency.

The second demerit is the smear which is produced in the solid-state imaging device, such as the CCD imager, due to the excess quantity of the incident light. As a means for eliminating the smear, there is known a technique of providing a drain region for sweeping out unnecessary charges at the proximal end in the forward transfer direction of the vertical register of the imaging section to effect reverse transfer of signal charges, as shown for example in "The Journal of The Institute of Television Engineerings of Japan, Image Information Engineering and Broadcasting Technology", vol. 141, No. 11, 1987, pages 1039 to 1046, or a technique of transferring signal charges in the forward direction through the horizontal register to sweep out unnecessary signal charges to a precharge drain at the terminal end of the horizontal register.

Meanwhile, with the technique of reverse transfer for sweeping out unnecessary signal charges, it becomes necessary to provide a circuit for transferring the charges in the reverse direction, so that a complex operation is necessitated to control the circuit. On the other hand, with the technique of sweeping out smear charges by the transfer through the horizontal register if an overflow occurs in the horizontal register by smear charges, it may present itself as an image defect.

Considering a device having a drain region for sweeping out unnecessary charges, which is provided along a horizontal register in adjacency to the side of the horizontal register opposite to the imaging section, it is necessary to lower the resistance of the drain region for efficient sweepout of the unnecessary charges. With such device, since a drain region is provided between the busline wiring and the horizontal register, a wider width of the drain region leads to an increased area on the chip and to an increased length of the transfer electrode of the horizontal register, thereby causing the propagation delay of the transfer clocks to the transfer electrode.

OBJECTS AND SUMMARY OF THE INVENTION

It is a primary object of the present invention to provide a solid-state image sensor adapted for improving the transfer efficiency across a plurality of horizontal charge transfer sections.

It is another object of the present invention to provide a solid state image sensor wherein unnecessary charges may be swept out efficiently to prevent image defects caused by smear charges.

The solid state image sensor of the present invention is basically constituted by a number of light receiving sections arranged in a matrix configuration, a plurality of vertical charge transfer sections provided in each vertical column of the light receiving sections and adapted for transferring the charges from said light receiving sections in the vertical direction, and horizontal charge transfer sections for transferring the charges from the vertical charge transfer sections in the horizontal direction. A storage section constituted by second vertical charge transfer sections may be provided between the vertical charge transfer sections adjacent to said light receiving sections and said horizontal charge transfer sections.

In one aspect of the present invention, a plurality of horizontal charge transfer sections are provided for reducing the horizontal transfer frequency. Charge transfer between the horizontal charge transfer sections may be controlled by a transfer gate. The transfer gate voltage may be transiently set to an intermediate voltage of gate voltage transition on termination of the charge transfer across the horizontal charge transfer sections or may be changed more slowly than during usual gate voltage transition. As a result, the transfer gate may be turned off after the charges in the channel region below the gate electrode have been fully transferred to the horizontal charge transfer section of the destination to avoid the risk that the charges being transferred be transferred back to the original horizontal charge transfer section.

In another aspect of the present invention, the solid state image sensor includes, in addition to the light receiving sections, vertical charge transfer sections and the horizontal charge transfer sections, a busline wiring provided along the horizontal charge transfer sections for supplying the current to the transfer electrodes, and a drain region provided between the busline wiring and the horizontal charge transfer sections for sweeping out unnecessary charges. The transfer electrodes of the horizontal charge transfer sections are connected to the busline wiring through regions defined between a plurality of contact holes formed in the drain region. On the side of the drain region, adjacent to the horizontal charge transfer section, there is provided a gate region for providing a reference potential for sweepout of the unnecessary charges.

With the transfer electrodes of the horizontal charge transfer sections connecting to the busline wiring being patterned to pass through regions defined between adjoining contact holes, the drain region may be supplied with the current by means of the contact holes to provide for highly efficient sweepout of the unnecessary charges.

PREFERRED EMBODIMENT OF THE INVENTION

The present embodiment gives an example of a frame interline transfer (FIT) type CCD image sensor which is provided with two horizontal charge transfer sections for lowering the horizontal charge transfer frequency.

Figure 1:
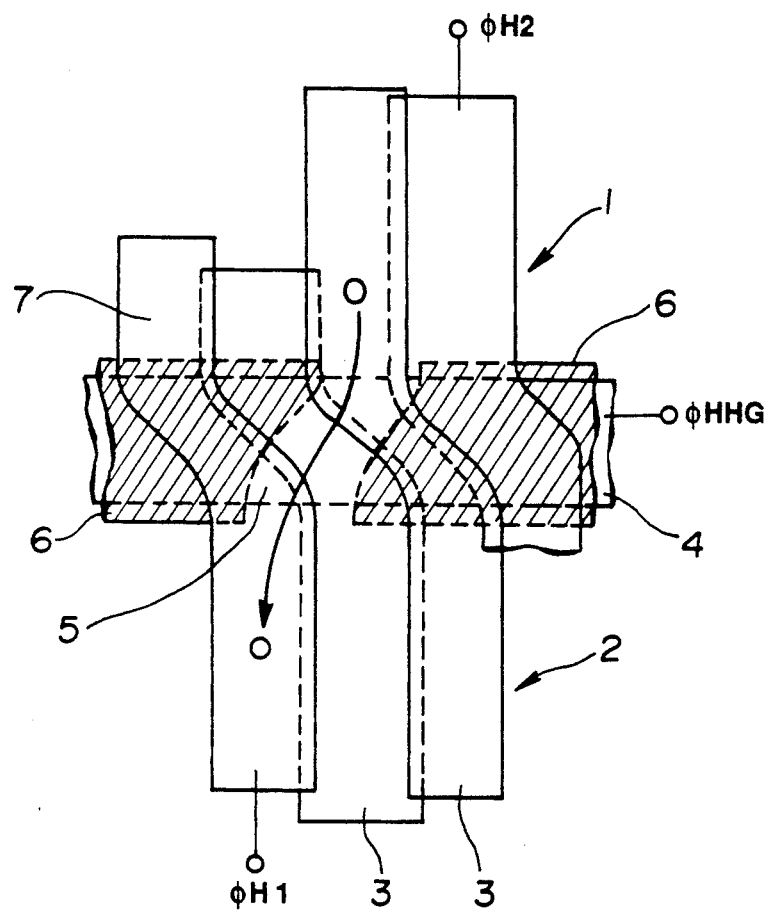
FIG. 1 is a plan view showing a pair of horizontal charge transfer sections of a conventional solid state image sensor, with a portion thereof being broken away.
Figure 2:
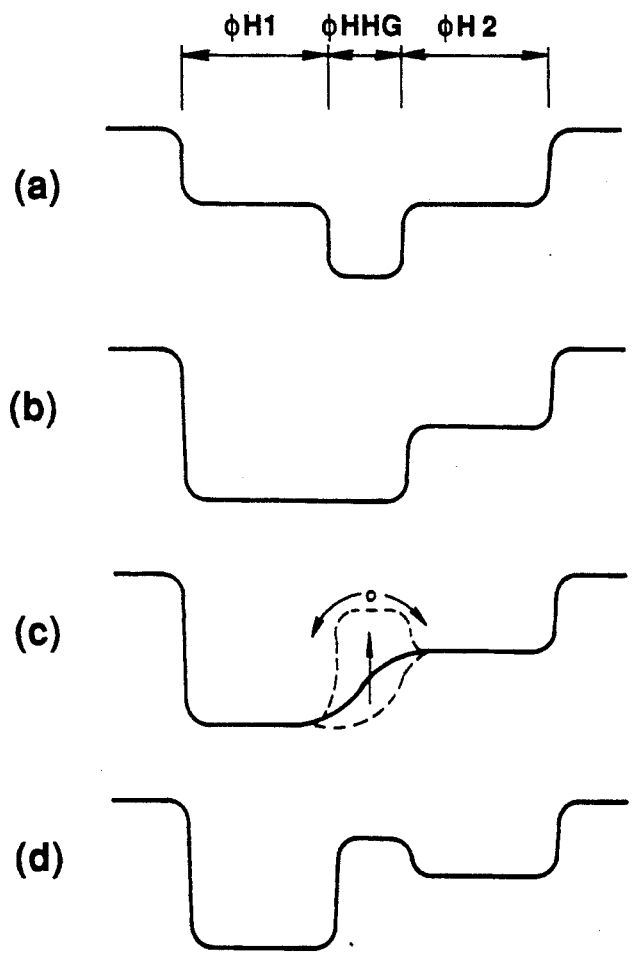
FIG. 2 is a diagram showing the electrical potential in the vicinity of the channel region on termination of charge transfer across horizontal registers in the conventional image sensor shown in FIG. 1.
Figure 3:
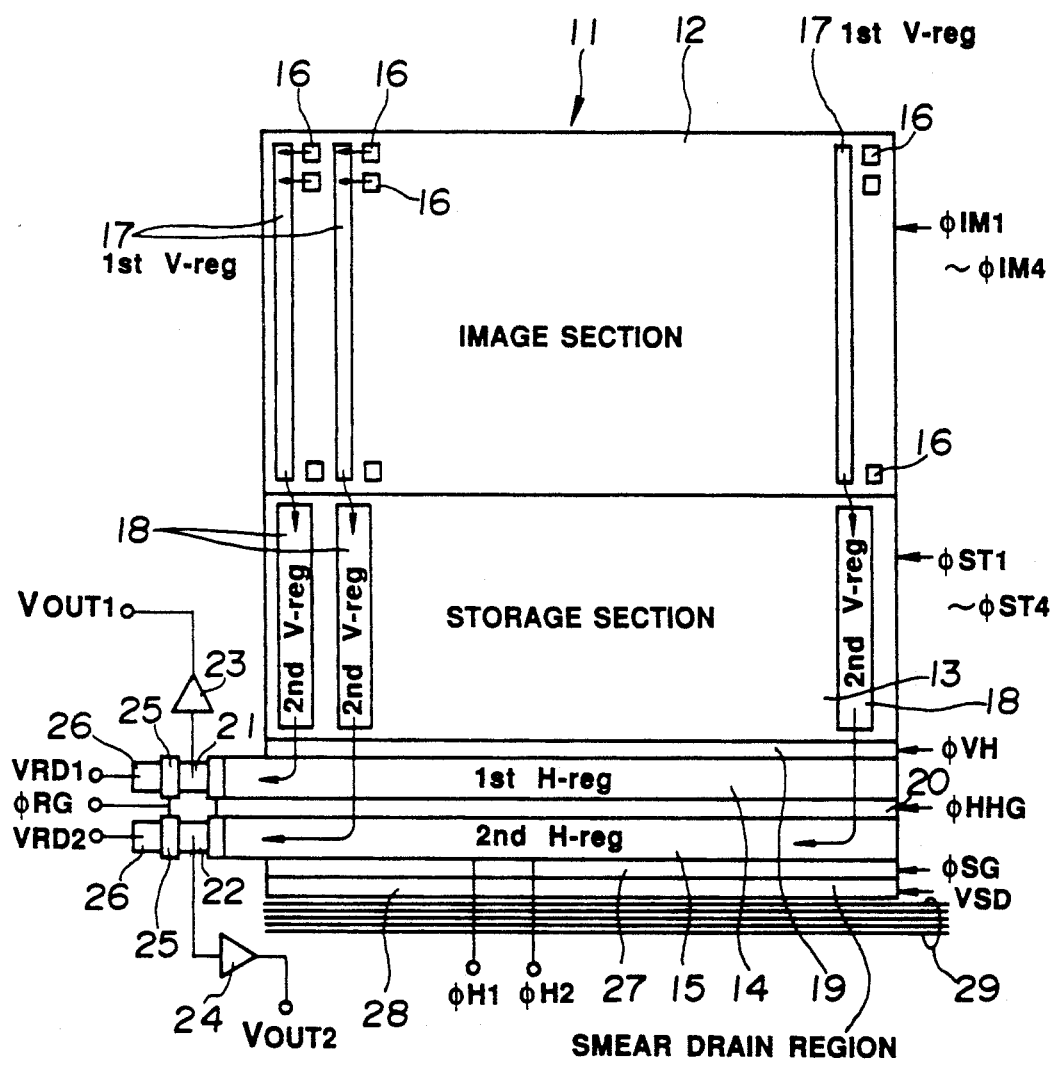
FIG. 3 is a diagrammatic plan view showing the construction of an embodiment of a solid-state image sensor according to the present invention.

FIG. 3 shows the image sensor in a diagrammatic plan view. A CCD image sensor 11 of the present embodiment is constituted mainly by an image section 12 for generating signal charges by photoelectric conversion, a storage section 13 for transiently storing the signal charges, a first horizontal register 14 as the horizontal charge transfer section and a second horizontal register 15 similarly as the horizontal charge transfer section. These components are formed by a semiconductor producing technique on a silicon substrate.

The image section 12 includes a number of light receiving sections 16 of a matrix configuration, where the incident light undergoes photoelectric conversion. As an example, each light receiving section 16 is formed by an n-type silicon substrate, an n-type impurity diffusion region, formed in a p-well, and a p-type positive hole accumulate layer on the surface of the diffusion region to constitute a pnpn structure when looking from the surface. A first vertical register 17 is provided for each vertical column along each vertical column of the light receiving sections 16. The first vertical registers 17 transfer the charges from the light receiving sections 16 in the vertical direction. In each vertical register 17, a buried channel layer for charge transfer is formed in the silicon substrate and a plurality of transfer electrodes are formed on the buried channel layer by the interposition of an insulating layer. Transfer signals $\phi IM1$ to $\phi IM4$ are supplied to the transfer electrodes of each first vertical register 17.

In the storage section 13, a plurality of second vertical register 18 are formed so as to be electrically connected to the first vertical registers 17, wherein the number of the first vertical register 17 corresponds to that of the second vertical register 18 in a one-to-one relationship. Smear may be diminished by transferring signal charges at an elevated speed from the first vertical registers 17 to the second vertical registers 18 during the vertical blanking period. Transfer signals $\phi ST1$ to $\phi ST4$ are supplied to these second vertical registers 18.

Between the storage section 13 and the first horizontal register 14, there is provided a gate 19 which is controlled by a signal $\phi VH$. The gate 19 is turned on and off when the signal $\phi VH$ is at the high and low levels, respectively.

The first and second horizontal registers 14 and 15 are provided parallel to each other at the lower vertical end of the storage register 13 by the interposition of the gate 19. Transfer electrodes are formed in these first and second horizontal registers 14 and 15, and the transfer electrodes are supplied with transfer signals $\phi H1, \phi H2$ which are antiphase to each other during high speed charge transfer. A transfer gate 20 is provided between the first and second horizontal registers 14 and 15 to control the transfer between the registers 14 and 15. The transfer gate 20 is supplied with a signal $\phi HHG$, the signal level of which controls the transfer between the two horizontal registers.

Floating diffusion regions 21 and 22 are provided at the terminal ends of the horizontal registers 14 and 15. The floating diffusion regions 21 and 22 are connected to amplifiers 23 and 24, respectively, so that the signal charges are converted into electrical voltages to issue output signals $V_{OUT1}$ and $V_{OUT2}$. The floating diffusion regions 21 and 22 are connected via reset gates 25 and 25 to reset drain regions 26, 26 supplied with voltages $VRD_1$ and $VRD_2$. Thus the floating diffusion regions 21 and 22 are reset or precharged by a signal $\phi RG$ supplied to reset gates 25, 25.

A smear gate electrode 27 supplied with the signal $\phi SG$ is provided along the side of the horizontal register 15, and a smear drain region 28 supplied with a voltage VSD, is formed along the side of the smear gate electrode 27. Smear charges are swept out by the smear gate electrode 27 and the smear drain region 28.

The smear drain region 28 is formed with a plurality of contact holes for efficient sweepout of unnecessary charges, as will be explained subsequently. These unnecessary charges may be absorbed by the wiring layer connecting to these connection parts.

Further away from the smear drain region 28 in the V direction is a busline wiring 29 consisting of a pattern of a plurality of parallel aluminum wiring layers. This busline wiring 29 is used for supplying the current to various components on a chip. The busline wiring 29 includes a line supplying the current to the transfer electrodes of the horizontal registers 14 and 15, a grounding voltage line, a power source voltage line or the like. The busline wiring 29 is connected to a bonding pad section, not shown, which is wire bonded to an external terminal, also not shown.

Figure 7:
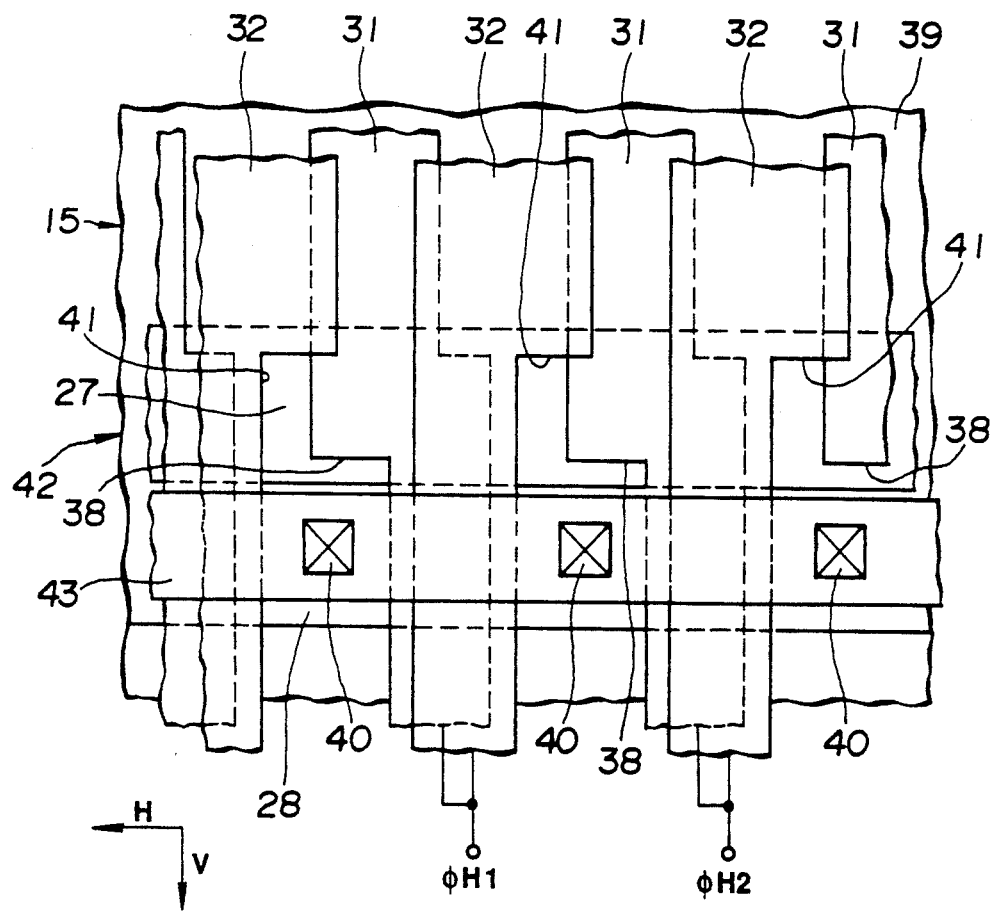
FIG. 7 is a plan view showing a smear drain region parallel to the horizontal registers of the embodiments shown in FIG. 3.

Referring to FIG. 7, the structure of the smear drain region 28 and its vicinity it explained.

The second horizontal register 15 is provided with transfer electrodes 31 and 32 formed by patterning a second polysilicon layer and a third polysilicon layer. A buried channel layer 39 is formed in a region on the substrate where the transfer electrodes 31 and 32 of the second and third polysilicon layers are formed by the interposition of an insulating film. Each transfer electrode 31 is bent in a crank shape, while having a side 38 extending in the H direction, over the gate electrode 27 of the first polysilicon layer between the smear drain region 28 and the horizontal register 15, and is again extended linearly over the smear drain region 28 in the V direction. This pattern of the transfer electrodes 31 is selected to prevent each transfer electrode 31 of the second polysilicon layer from overlying the contact holes 40 in the smear drain region 28 in superposed relation therewith, such that the transfer electrodes 31 pass through the regions defined between the adjoining contact holes 40. The transfer electrodes 31 are connected at their terminal endsd with the busline wiring 29 and the patterns of the transfer electrodes 31 are supplied alternately with transfer signals $\phi H1$ and $\phi H2$ by means of the busline wiring 29. The transfer electrodes 32 of the third polysilicon layer are of a pattern extending in the V direction over the second horizontal register 15, similarly to the transfer electrodes 31, with the both ends of each transfer electrode 32 in the charge transfer direction or the H direction being partially overlapped with the adjoining transfer electrodes 31. Each transfer electrode 32 of the third polysilicon layer is reduced in width above the gate electrode 27, starting at a side 41 extending in the H direction, and is extended further in the V direction with the thus reduced width.

Similarly to the above described pattern of the transfer electrode 32, the pattern of the transfer electrode 32 is selected to prevent the transfer electrode 32 from overlying the contact hole 40 in the smear drain region 28 in superposed relation therewith. The patterns of the transfer electrodes 32 of the third layer pass through the regions between the adjoining contact holes 40 over the smear drain region 28, as the patterns are overlapped with those of the transfer electrodes 31 of the second polysilicon layer. The transfer electrodes 32 are connected at their terminal ends with the busline wiring 29 and transfer signals $\phi H1$ and $\phi H2$ are alternately supplied by the busline wiring 29 to the patterns of the transfer electrodes 32.

The smear gate electrode 27 is formed in the gate region 42 on the insulating film on the substrate. The smear charge sweepout level is determined by a predetermined voltage applied to the smear gate electrode 27. Thus the substrate surface below the smear gate electrode 27 proves to be the channel region for smear charges and overflowing charges are drained out by way of the channel region. Above the gate electrode 27, the transfer electrode 31 formed by the second polysilicon layer and the transfer electrode 32 formed by the third polysilicon layer are bent in the crank shape and narrowed in width, respectively, for clearing the contact holes 40. Step-like level difference may be alleviated by the sides 41 and 38 being not at the same position in the V direction.

The smear charges, which are unnecessary charges, are swept out in the smear drain region 28, which is the n-type impurity diffusion region formed in the P well adapted for preventing the overflow of the horizontal register 15 with the smear charges. The smear drain region 28 in formed with plural contact holes 40 for efficient sweepout of the unnecessary signal charges. These contact holes 40 are formed through an interlayer insulating film electrically interconnecting the smear drain region 28 and the aluminum wiring layer 43 extending on the smear drain region 28 with the H direction as the longitudinal direction. The aluminum wiring layer 43 is provided in a pattern extending parallel to the smear gate electrode 27 and is supplied with a predetermined voltage VSD to be supplied to the drain region 28. With the CCD imager of the present embodiment, the transfer electrodes 31 formed by the second polysilicon layer and the transfer electrodes 32 formed by the third polysilicon layer are bent or narrowed in width so as to pass through the region between the adjacent contact holes 40 to clear the contact holes 40. Thus the aluminum wiring layer 43 may be positively connected to the smear drain region 28. The aluminum wiring layer 43 is formed by the same layer as the busline wiring 29. Although each set of the transfer electrodes 31 and 32 or each bit is associated with a contact hole 40 in the present embodiment, this is not limitative of the present invention.

With the above described CCD imager of the present embodiment, the transfer electrodes of the horizontal register 15 formed by the second and third polysilicon layer are of such a pattern that these electrodes pass through the region between the contact holes 40 in the smear drain region 28 so as to be connected to the busline wiring 29. Thus the smear charges may be swept out effectively without in any way increasing the width in the V direction of the smear drain region 28. Since the width in the V direction of the smear drain region 28 is not enhanced, it becomes possible to shorten the distance between the busline wiring 29 and the horizontal register 15 to prevent the propagation delay of the transfer clocks supplied to the transfer electrodes.

Figure 4:
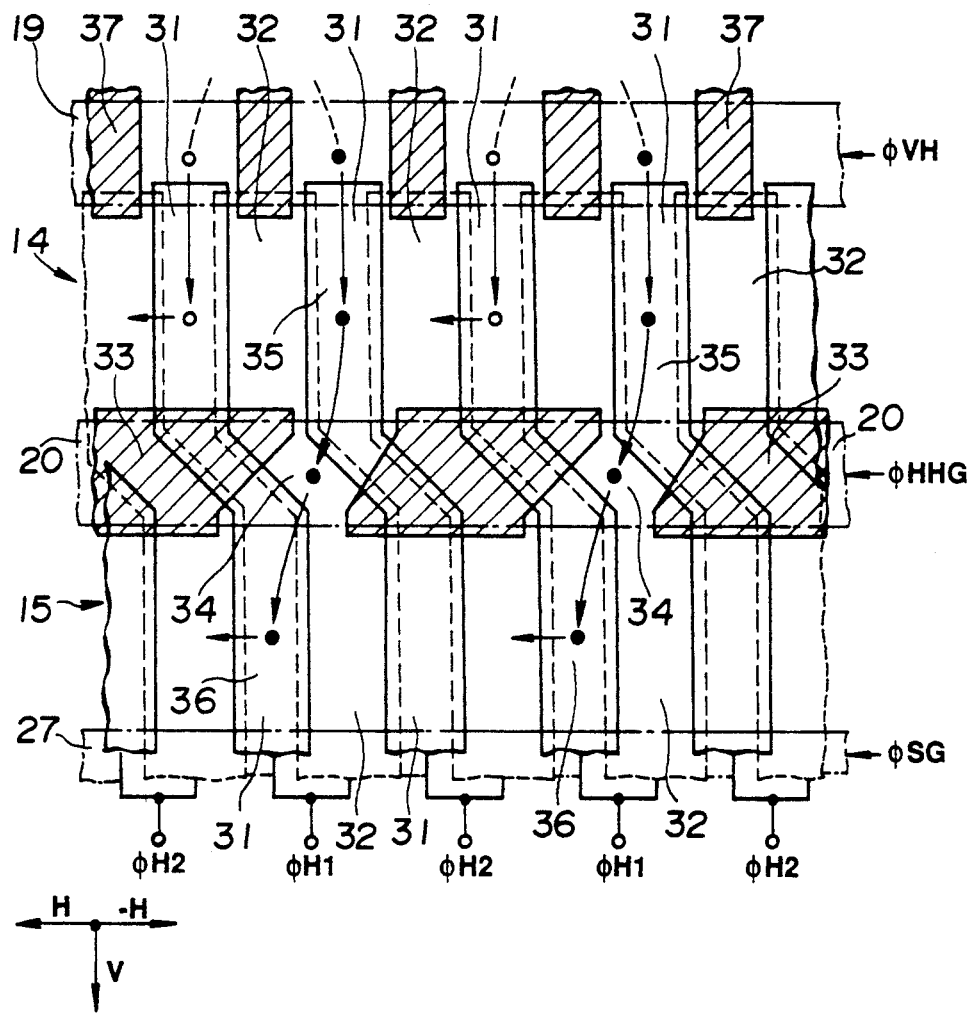
FIG. 4 is a plan view showing a pair of horizontal charge transfer sections of the embodiment shown in FIG. 3.

FIG. 4 shows, in a plan view, the region between the two horizontal registers 14 and 15. These horizontal registers 14 and 15 are provided with the transfer gate 20 in-between. The first horizontal register 14 is sandwitched between the gate 19 and the transfer gate 20, both formed by the first polysilicon layer, as shown by chain-dotted lines, while the second horizontal register 15 is sandwitched between the transfer gate 20 and the smear gate electrode 27 similarly formed by the first polysilicon layer. The horizontal registers 14 and 15 are provided with transfer electrode 31 and transfer electrodes 32 formed by the second and third polysilicon layers, respectively. The transfer electrodes 31, shown by solid lines, are formed by patterning the second polysilicon layer, with the V direction in the drawing as the longitudinal direction. However, they are deviated by a distance about equal to the pattern width in the −H direction over the transfer gate 20 to prevent the electrodes from extending linearly across the two horizontal registers 14 and 15. The transfer electrodes 31 remain substantially rectangular on the horizontal registers 14 and 15. The transfer electrodes 31 are spaced apart at a predetermined distance in the H direction, and the transfer electrodes 32, formed by the third polysilicon layer, are formed so as to cover the spacing between the transfer electrodes 31 and to be superposed at the marginal edges thereof with the transfer electrodes 31, as shown by broken lines in FIG. 4. Similarly to the transfer electrodes 31, the transfer electrodes 32 are extended with the V-direction in the drawing as the longitudinal direction. However, the transfer electrodes 32 are similarly deviated by a distance about equal to the pattern width in the −H direction over the transfer gate 20 to prevent the electrodes from lying linearly across the two horizontal registers 14 and 15. The transfer electrodes 32 are overlapped at the marginal edges thereof in the H and −H directions with the transfer electrodes 31 and remain substantially rectangular above the horizontal register 14 and 15. The sets of the transfer electrodes 31 and 32 are alternately supplied with transfer signals $\phi H1$ and $\phi H2$. Thus, one of the transfer electrodes 32 adjacent to a given transfer electrode 31 is necessarily supplied with the transfer signal in phase with that supplied to the transfer electrode 31. In the present embodiment, the in-phase transfer signal $\phi H1$ or $\phi H2$ is supplied to the transfer electrode 32 adjacent to the −H side of the transfer electrode 31. Also, under the same impressed voltage, the potential well of the channel layer at the lower region of the transfer electrode 31 is deeper than that of the channel layer formed below the transfer electrode 32, such that the transfer electrode 31 acts as the storage section and the transfer electrode 32 acts as the transfer section.

Channel stop regions 33, shown by hatching lines in FIG. 4, are formed on the surface of the silicon substrate below the transfer gate 20, with the regions sandwitched between the adjoining channel stop regions 33 functioning as the channel regions 34. These channel regions 34 are of such a pattern that the regions 34 are deviated or bent obliquely with respect to both the H and V directions below the transfer gate 20, with the direction of the bends of the channel regions 34 intersecting the direction of the bends of the transfer electrodes 31 and 32. Each channel region 34 is provided so that a region 35 of the first horizontal register 14 controlled by the transfer signal $\phi H2$ and a region 36 of the second horizontal register 15 controlled by the transfer signal $\phi H1$ lie opposite to both ends of the channel region 34. Since the channel region 34 is provided in contiguity to the region 35 controlled by the transfer signal $\phi H2$ of the first horizontal register 14, the region of the first horizontal register 14 controlled by the transfer signal $\phi H1$ is contiguous to the channel stop region 33. Thus, even with increase in the gate voltage of the transfer gate 20, there is no risk that charges be transferred from the region of the first horizontal register 14 controlled by the transfer signal $\phi H1$ to the second horizontal register 15. It is noted that channel stop regions 37 shown by hatching lines are similarly provided below the gate 19.

With the above described CCD imager of the present embodiment, provided with the first horizontal register 14 and the second horizontal register 15, charges are transferred in a distributed manner between the horizontal registers for diminishing the horizontal transfer frequency. Circle marks in FIG. 4 indicate charges transferred as far as the first horizontal register 14. Since these charges are transferred from the storage region 13 to the region 35 of the first horizontal register 14 controlled by the transfer signal $\phi H1$, they remain in the first horizontal register 14. On the other hand, charges shown by black circle marks indicate those transferred to the second horizontal register 15 by way of the first horizontal register 14. Since they are transferred from the storage section 13 to the region of the first horizontal register 35 controlled by the transfer signal $\phi H2$, they are transferred to the region 36 of the second horizontal register 15 by way of the channel region 34.

Referring now to FIGS. 5 and 6(a) to (d), distributed charge transfer between the horizontal registers, as indicated by black circle marks, will be explained.

Figure 6:
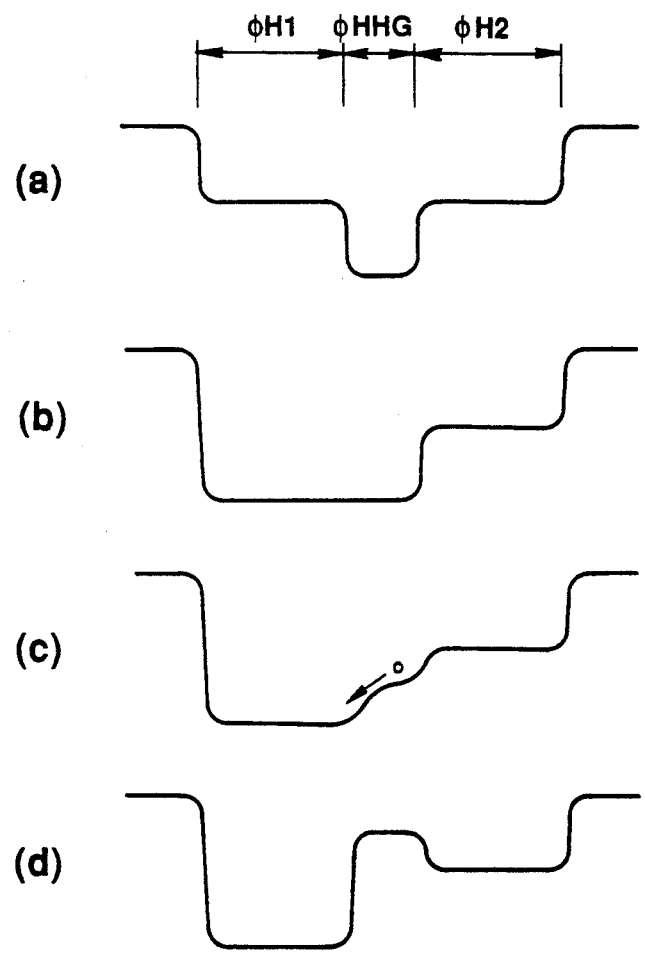
FIGS. 6(a) to 6(d) are diagrams showing the electrical potential in the vicinity of the channel region on termination of charge transfer across horizontal registers in the embodiment shown in FIG. 3.

The signal $\phi HHG$, supplied to the transfer gate 20, goes first to a high level to turn on the transfer gate 20. The transfer signals $\phi H1$ and $\phi H2$, supplied to the transfer electrodes 31 and 32, go to a low level. The charges in the region 35 of the first horizontal register 14 are thereby transferred to at least the channel region 34. At this time, only the potential of the region supplied with the signal $\phi HHG$ is deepened, as shown in FIG. 6(a).

Figure 5:
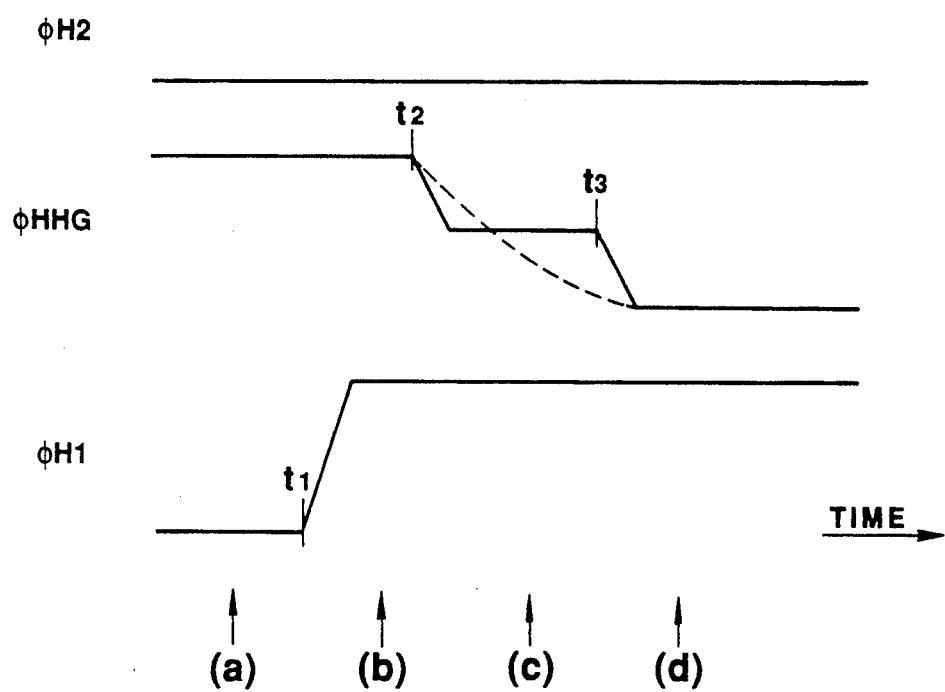
FIG. 5 is a timing chart showing signal levels at the time of termination of charge transfer across the horizontal registers of the embodiment of the solid state image sensor shown in FIG. 3.

Then, at a time $t_1$ of FIG. 5, the signal level of the signal $\phi H1$ controlling the region 36 of the second horizontal register 15, which is the destination of charge transfer, is charged from the low level to the high level. This causes the potential of the region 36, supplied with the signal $\phi H1$, to be deepened, as shown in FIG. 6(b), so that the charges are transferred to the region 36.

Then, at time $t_2$ of FIG. 5, the signal $\phi HHG$ supplied to the transfer gate 20, is changed from the high level to an intermediate level, instead of to the low level. This causes the potential of the channel region 34 to assume an intermediate level between the potential of the region 35 of the first horizontal register 14 and that of the region 36 of the second horizontal register 15, as shown in FIG. 6(c), so that the signal charges are fully transferred to the region 36 of the second horizontal register 15.

Then, at time $t_3$ in FIG. 5, the signal level of the signal $\phi HHG$, applied to the transfer gate 20, is charged to the low level from the intermediate level to turn off the transfer gate 20. At this time, since the charges have already been fully charged to the second horizontal register 15 at the time point when the signal φHHG has been set to the intermediate level, there is no risk that the charges be transferred back from the channel region 34.

The above refers to an example in which, on termination of the distributed charge transfer, the signal φHHG is changed transiently from the high level to the intermediate level, and then changed ultimately from the intermediate level to the low level, by way of changing the signal level of the signal φHHG step by step. In this manner, the charge transfer efficiency may be improved. However, similar effects may be attained by changing the signal level of the signal φHHG more slowly than usual, as indicated by a broken line in FIG. 5. Such retarded signal level transition may be realized, for example, by switching the driving capability of the driver driving the transfer gate 20 or by increasing the time constant by addition of a capacity or a resistor only during the retarded transition.

Although the foregoing refers to the frame interline transfer CCD solid state image sensor, the present invention may also be applied to an interline transfer CCD solid-state image sensor. The solid state image sensor of the present invention may have more than two horizontal registers, while the transfer signals transferring the horizontal registers are not limited to two-phase signals.

What is claimed is:

1. A solid state image sensor comprising
   a plurality of light receiving devices arranged in a matrix configuration,
   a plurality of vertical charge transfer devices provided for each column of said light receiving devices and configured for transferring charges from said light receiving devices in the vertical direction,
   at least two horizontal charge transfer sections configured for receiving the charges from said vertical charge transfer devices and transferring the charges in the horizontal direction,
   a transfer gate configured for controllably transferring charges between said horizontal transfer sections; and
   a gate voltage which is applied to the transfer gate for controlling charge transfer between the horizontal charge transfer sections;
   wherein the gate voltage of the transfer gate controlling charge transfer between said horizontal charge transfer sections is controllably transitioned between a turn-on voltage and a turn-off voltage such that the gate voltage is transiently set to an intermediate voltage which lies between the turn-on and the turn-off voltages upon termination of a charge transfer between said horizontal charge transfer sections.

2. A solid state image sensor comprising
   a plurality of light receiving devices arranged in a matrix configuration,
   a plurality of vertical charge transfer devices provided for each column of said light receiving devices and configured for transferring charges from said light receiving devices in the vertical direction,
   at least two horizontal charge transfer sections configured for receiving the charges from said vertical charge transfer devices and transferring the charges in the horizontal direction,
   a charge transfer gate configured for controlling charge transfer between said horizontal charge transfer sections,
   a gate voltage which is applied to said transfer gate for controlling charge transfer between said horizontal charge transfer sections;
   wherein the gate voltage of the transfer gate controlling charge transfer between said horizontal charge transfer sections is controlled such that the gate voltage transitions between a turn-on voltage and a turn-off voltage more slowly than a usual gate voltage transitions upon termination of charge transfer between said horizontal charge transfer sections.

3. A solid state image sensor according to claim 1 or 2, wherein said horizontal charge transfer sections have a plurality of transfer electrodes employed commonly in each said horizontal charge transfer section.

4. A solid state image sensor comprising:
   a plurality of light receiving devices arranged in a matrix configuration,
   a plurality of vertical charge transfer devices provided for each column of said light receiving devices and configured for transferring charges from said light receiving devices in the vertical direction,
   a plurality of horizontal charge transfer sections for receiving the charges from the vertical charge transfer devices and transferring in the horizontal direction the charges from the vertical charge transfer devices under control of a plurality of transfer electrodes associated therewith,
   a busline wiring provided along said horizontal charge transfer sections for supplying current to said transfer electrodes,
   a smear drain region provided between said busline wiring and said horizontal charge transfer sections for sweeping out unnecessary charges, and
   a plurality of spaced-apart contact holes formed in said smear drain region;
   wherein said transfer electrodes of said horizontal charge transfer sections are so configured to be connected to said busline wiring through regions defined between said plurality of contact holes formed in said smear drain region.

5. A solid state image sensor according to claim 4, wherein said drain region is supplied with a predetermined voltage through said contact holes by a wiring which is formed by the same layer as said busline wiring.

6. A solid state image sensor comprising:
   a plurality of light receiving devices arranged in a matrix configuration,
   a plurality of first vertical charge transfer devices provided for each column of said light receiving devices and configured for transferring charges from said light receiving devices in the vertical direction,
   at least two horizontal charge transfer sections configured for receiving the charges from the first vertical charge transfer devices and transferring the charges in the horizontal direction,
   a charge transfer gate configured for controllably transferring the charges between the horizontal charge transfer sections,
   a gate voltage which is applied to the transfer gate for controlling charge transfer between the horizontal charge transfer sections, the gate voltage being controllably transitioned between a turn-on voltage and a turn-off voltage such that the gate voltage is transiently set to an intermediate voltage which lies between the turn-on and turn-off voltages upon termination of charge transfer between the horizontal charge transfer sections, and a plurality of second vertical charge transfer devices provided between said first vertical charge transfer devices and said horizontal charge transfer sections for temporarily storing charges prior to transfer of the charges from the first vertical charge transfer devices to the horizontal charge transfer sections.

7. A solid state image sensor comprising:

a plurality of light receiving devices arranged in a matrix configuration, a first plurality of first vertical charge transfer devices provided for each column of said light receiving devices and configured for transferring charges from the light receiving devices in the vertical direction, at least two horizontal charge transfer sections configured for receiving the charges from the first vertical charge transfer devices and transferring the charges in the horizontal direction, a transfer gate configured for controllably transferring the charges between the horizontal charge transfer sections, a gate voltage which is applied to the transfer gate for controlling charge transfer between the horizontal charge transfer sections, the gate voltage being transitioned between a turn-on voltage and a turn-off voltage more slowly than a usual gate voltage is transitioned upon termination of charge transfer between the horizontal charge transfer sections, and a plurality of second vertical charge transfer devices provided between the first vertical charge transfer devices and the horizontal charge transfer sections for temporarily storing charges prior to transfer of the charges from the first vertical charge transfer devices to the horizontal charge transfer sections.

* * * * *